US012261086B2

(12) United States Patent
Hsu et al.

(10) Patent No.: US 12,261,086 B2
(45) Date of Patent: *Mar. 25, 2025

(54) METHOD FOR INTEGRATING HIGH-VOLTAGE (HV) DEVICE, MEDIUM-VOLTAGE (MV) DEVICE, AND LOW-VOLTAGE (LV) DEVICE

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Yu-Hsiang Lin, New Taipei (TW); Chien-Ting Lin, Tainan (TW); Chun-Ya Chiu, Tainan (TW); Chia-Jung Hsu, Tainan (TW); Chin-Hung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 151 days.

This patent is subject to a terminal disclaimer.

(21) Appl. No.: 17/586,699

(22) Filed: Jan. 27, 2022

(65) Prior Publication Data

US 2023/0197523 A1 Jun. 22, 2023

(30) Foreign Application Priority Data

Dec. 17, 2021 (CN) .......................... 202111550730.5

(51) Int. Cl.
H01L 21/8234 (2006.01)
H01L 23/60 (2006.01)
H01L 27/088 (2006.01)

(52) U.S. Cl.
CPC ............... *H01L 21/823456* (2013.01); *H01L 21/823431* (2013.01); *H01L 23/60* (2013.01); *H01L 27/0886* (2013.01)

(58) Field of Classification Search
CPC ..... H01L 21/823456; H01L 21/823431; H01L 23/60; H01L 27/0886
See application file for complete search history.

(56) References Cited

U.S. PATENT DOCUMENTS

| 8,085,518 | B2 | 12/2011 | Chaudhary et al. |
| 10,090,410 | B1 | 10/2018 | Chi et al. |
| 2022/0115508 | A1* | 4/2022 | Lin ..................... H01L 27/0922 |
| 2023/0154922 | A1* | 5/2023 | Yang ............... H01L 21/823462 |
| | | | 257/369 |

* cited by examiner

*Primary Examiner* — Lex H Malsawma
*Assistant Examiner* — Bruce R. Smith
(74) *Attorney, Agent, or Firm* — Winston Hsu

(57) ABSTRACT

A method for fabricating a semiconductor device includes first providing a substrate having a high-voltage (HV) region, a medium-voltage (MV) region, and a low-voltage (LV) region, forming a HV device on the HV region, and forming a LV device on the LV region. Preferably, the HV device includes a first base on the substrate, a first gate dielectric layer on the first base, and a first gate electrode on the first gate dielectric layer. The LV device includes a fin-shaped structure on the substrate, and a second gate electrode on the fin-shaped structure, in which a top surface of the first gate dielectric layer is even with a top surface of the fin-shaped structure.

7 Claims, 11 Drawing Sheets

METHOD FOR INTEGRATING HIGH-VOLTAGE (HV) DEVICE, MEDIUM-VOLTAGE (MV) DEVICE, AND LOW-VOLTAGE (LV) DEVICE

BACKGROUND OF THE INVENTION

1. Field of the Invention

The invention relates to a method of fabricating semiconductor device, and more particularly to a method of integrating high-voltage (HV) device, medium-voltage (MV) device, and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device or high-voltage (HV) device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

A method for fabricating a semiconductor device includes first providing a substrate having a high-voltage (HV) region, a medium-voltage (MV) region, and a low-voltage (LV) region, forming a first transistor on the HV region, and forming a second transistor on the LV region. Preferably, the first transistor includes a first base on the substrate, a first gate dielectric layer on the first base, and a first gate electrode on the first gate dielectric layer. The second transistor includes a fin-shaped structure on the substrate, and a second gate electrode on the fin-shaped structure, in which a top surface of the first gate dielectric layer is even with a top surface of the fin-shaped structure.

According to another aspect of the present invention, a semiconductor device includes a substrate having a high-voltage (HV) region, a medium-voltage (MV) region, and a low-voltage (LV) region, a HV device on the HV region, and a LV device on the LV region. Preferably, the HV device includes a first base on the substrate, a first gate dielectric layer on the first base, and a first gate electrode on the first gate dielectric layer. The LV device includes a fin-shaped structure on the substrate and a second gate electrode on the fin-shaped structure, in which a top surface of the first gate dielectric layer is even with a top surface of the fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
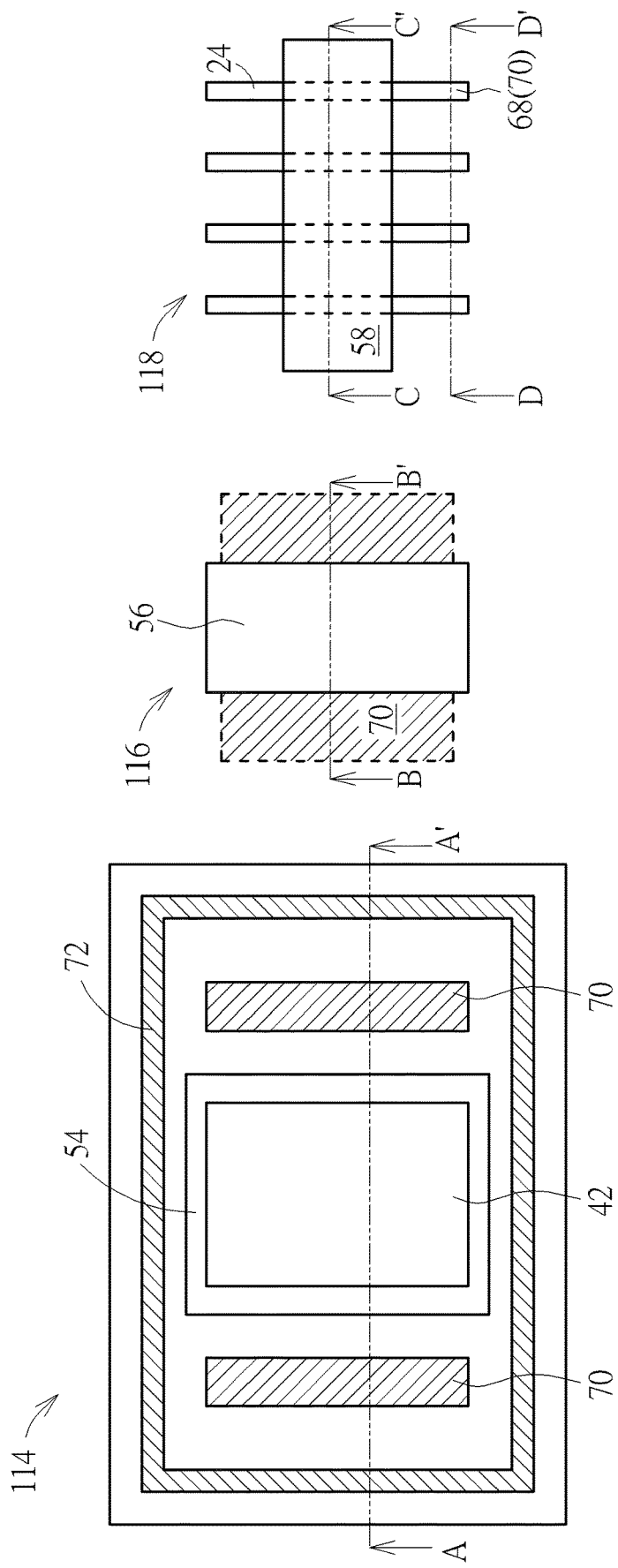
FIGS. 1-11 illustrate a method for fabricating a semiconductor device according to an embodiment of the present invention.
Figure 2:
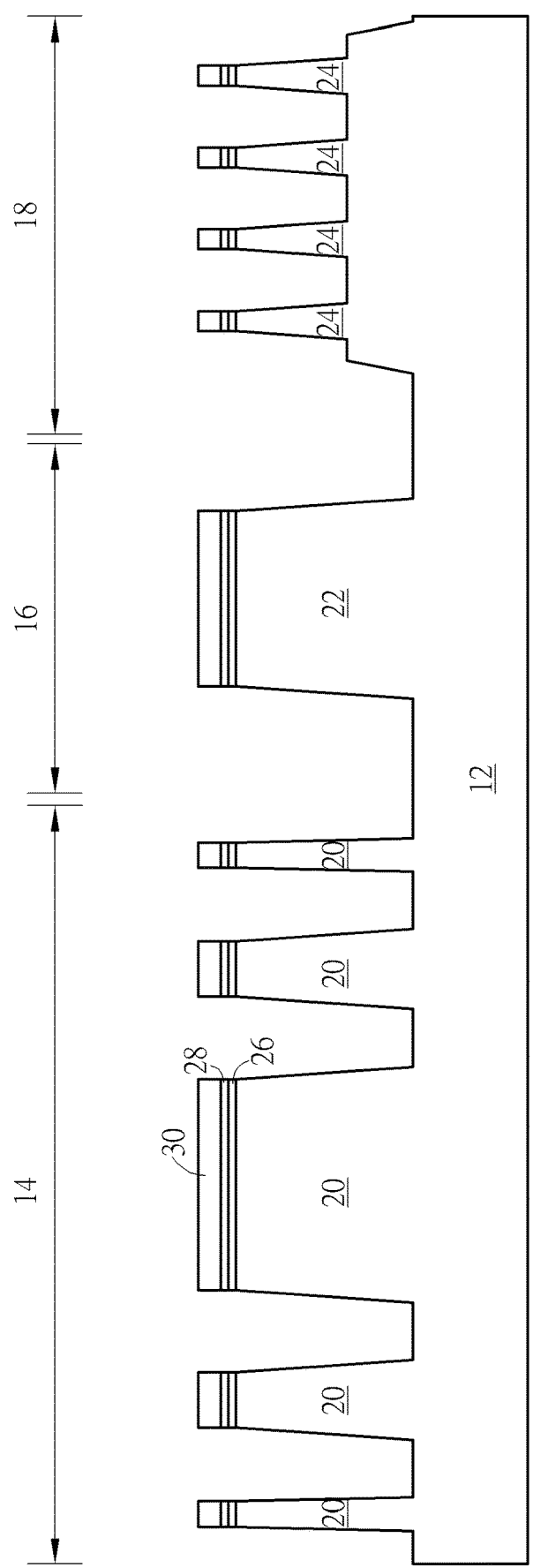

Referring to FIGS. 1-11, FIGS. 1-11 illustrate a method for fabricating a semiconductor device according to an embodiment of the present invention, in which FIG. 1 illustrates a top view for fabricating the semiconductor device according to an embodiment of the present invention and FIGS. 2-11 illustrate cross-section views for fabricating the semiconductor device along the sectional lines AA', BB', and CC'. As shown in FIGS. 1-2, a substrate 12, such as a silicon substrate or silicon-on-insulator (SOI) substrate is provided and three or more transistor regions, such as a high voltage (HV) region 14, a medium-voltage (MV) region 16, and a low-voltage (LV) region 18 are defined on the substrate 12, in which at least a HV device 114 is disposed on the HV region 14, a MV device 116 is disposed on the MV region 16, and a LV device 118 is disposed on the LV region 18. Preferably, FIGS. 2-11 are cross-section views illustrating a method for fabricating the semiconductor device taken along the sectional line AA' of the HV region 14, the sectional line BB' of the MV region 16, and the sectional line CC' of the LV region 18.

In this embodiment, the three regions 14, 16, 18 could be transistor regions having same conductive type or different conductive types. For instance, each of the three regions 14, 16, 18 could be a PMOS region or a NMOS region and the three regions 14, 16, 18 are defined to fabricate gate structures having different threshold voltages in the later process. Preferably, it would be desirable to first conduct an implantation process to form p-type deep wells on the HV region 14 and MV region 16 and a n-type deep well on the LV region 18, but not limited thereto.

Next, bases 20, 22 are formed on the HV region 14 and MV region 16 and a plurality of fin-shaped structures 24 are formed on the substrate 12 of the LV region 18. Preferably, the bases 20, 22 and the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the bases 20, 22 and the fin-shaped structures 24 could also be obtained by first forming a patterned mask (not shown) on the substrate, 12, and through an etching process, the pattern of the patterned mask is transferred to the substrate 12 to form the bases 20, 22 and the fin-shaped structures 24. Moreover, the formation of the bases 20, 22 and the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the bases 20, 22 and fin-shaped structures 24. These approaches for forming the bases 20, 22 and fin-shaped structures 24 are all within the scope of the present invention.

In this embodiment, a liner 26, a liner 28, and a hard mask 30 could be formed on each of the bases 20, 22 and the fin-shaped structures 24 during the aforementioned patterning process, in which the liner 26 preferably includes silicon oxide ($SiO_2$), the liner 28 includes silicon nitride (SiN), and the hard mask 30 includes silicon oxide ($SiO_2$), but not limited thereto.

Figure 3:
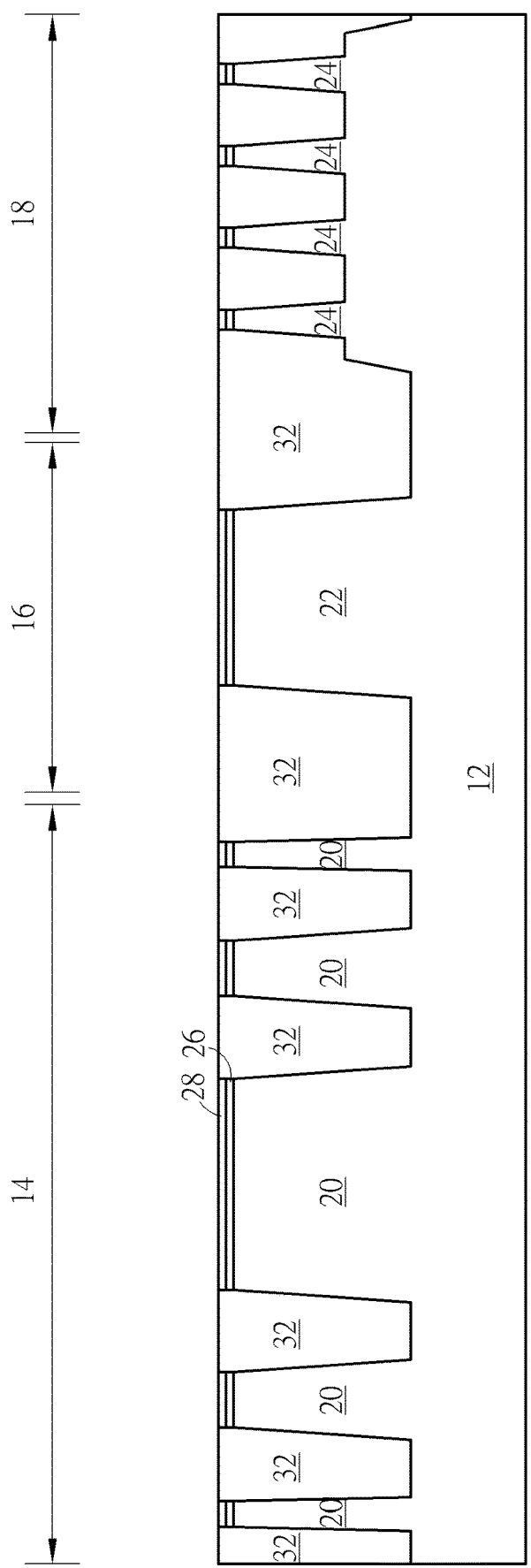

Next, as shown in FIG. 3, a flowable chemical vapor deposition (FCVD) process is conducted to form an insulating layer 32 made of silicon oxide on the bases 20, 22 and the fin-shaped structures 24 and filling the trenches between the bases 20, 22 and the fin-shaped structures 24, and a planarizing process such as chemical mechanical polishing (CMP) process is conducted to remove the hard mask 30 and part of the insulating layer 32 so that the top surfaces of the liner 28 and the insulating layer 32 are coplanar.

Figure 4:
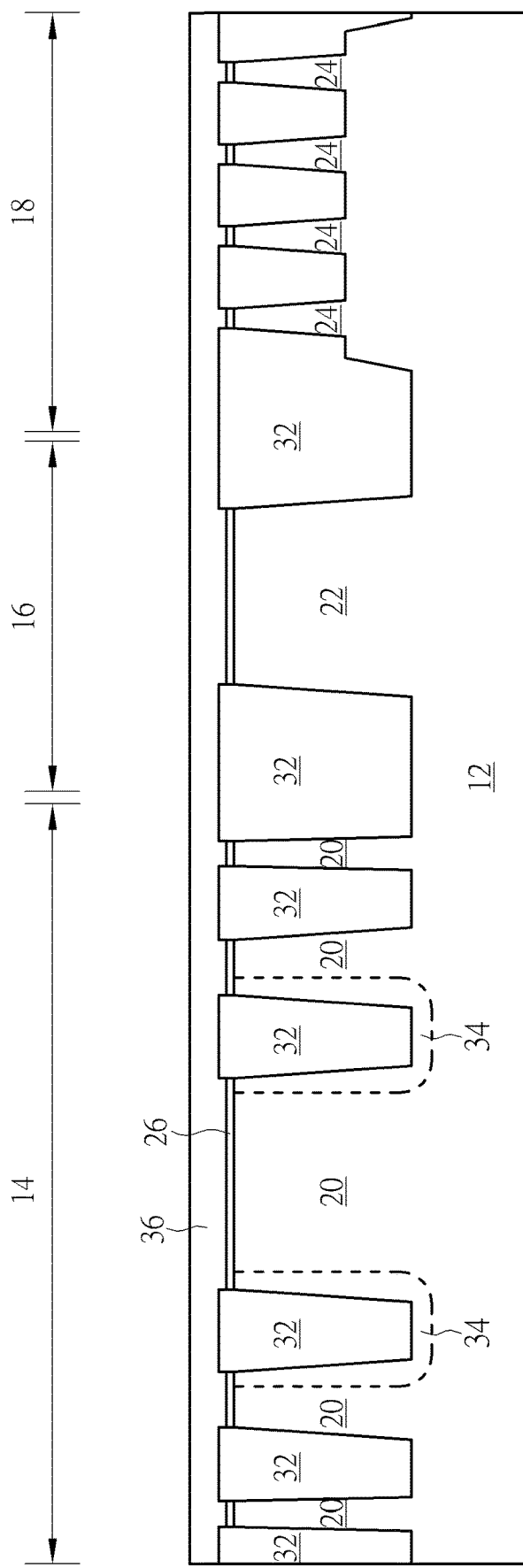

Next, as shown in FIG. 4, the liner 28 made of silicon oxide is removed through etching process to expose the liner 26 made of silicon nitride underneath. As a result, the top surface of the insulating layer 32 becomes slightly higher than the top surface of the liner 26 and at the same time forming recesses (not shown) directly above the liner 26. Next, an ion implantation process is conducted to form doped regions 34 in the base 20 on the HV region 14, in which the doped regions 34 preferably serve as lightly doped drains (LDDs) for the HV device 114 formed afterwards. Next, a hard mask 36 is formed on the bases 20, 22 and fin-shaped structures 24 on the HV region 14, the MV region 16, and the LV region 18 and filling the recesses above the liner 26. In this embodiment, the hard mask 36 is preferably made of SiN, but not limited thereto.

Figure 5:
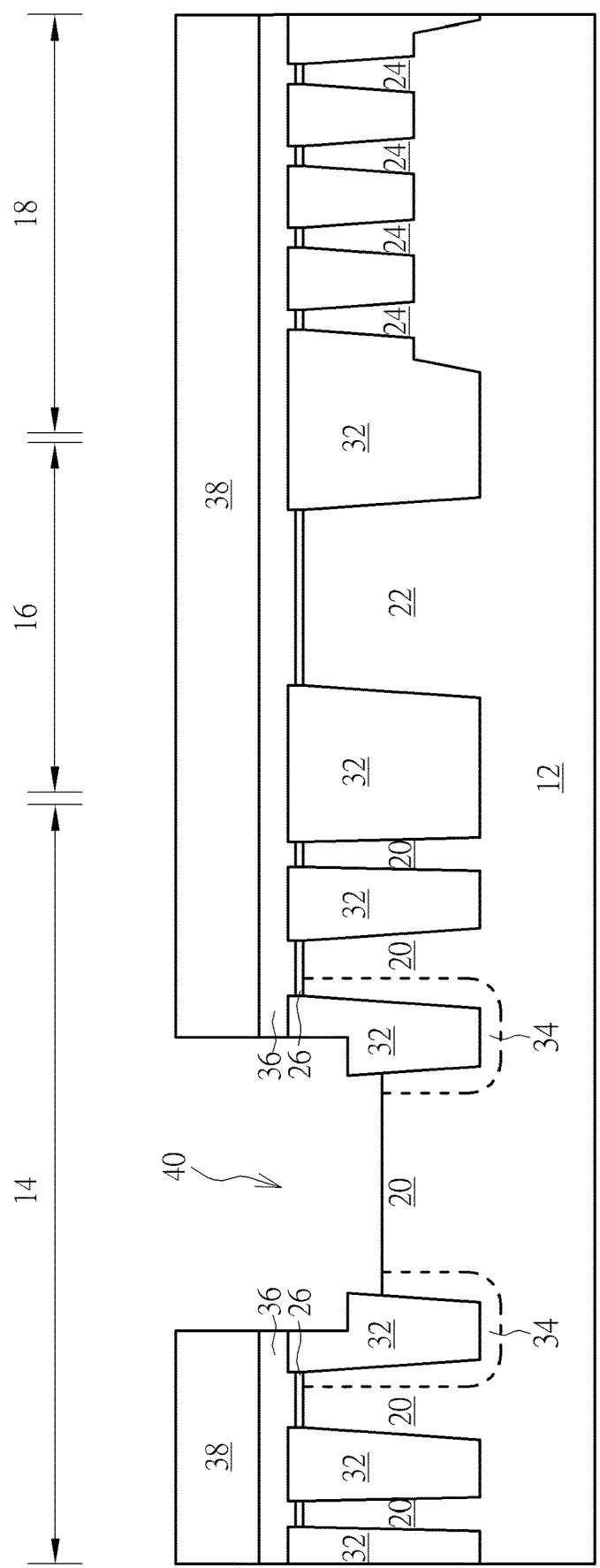

Next, as shown in FIG. 5, a patterned mask 38 such as a patterned resist is formed on the hard mask 36 on the MV region 16 and the LV region 18 as the patterned mask 38 includes an opening exposing the surface of the hard mask 36 on the HV region 14. Next, an etching process is conducted by using the patterned mask 38 as mask to remove part of the hard mask 36, part of the base 20, and part of the insulating layer 32 adjacent to two sides of the base 20 for forming a trench 40.

Figure 6:
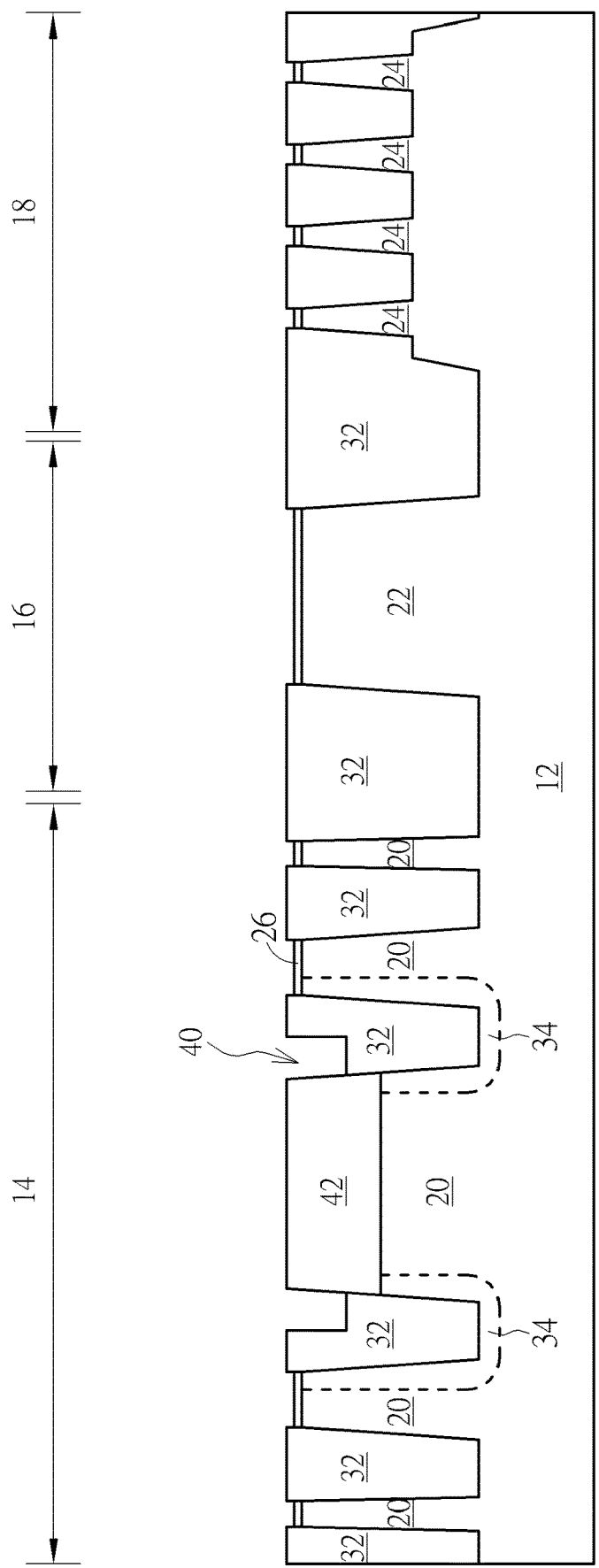

Next, as shown in FIG. 6, an oxide growth process or more specifically a rapid thermal oxidation (RTO) process is conducted to form a gate dielectric layer 42 made of silicon oxide on the base 20 on the HV region 14, and the patterned mask 38 and the hard mask 36 are completely removed thereafter. Preferably, the remaining trench 40 formed by the patterned mask 38 is adjacent to two sides of the gate dielectric layer 42 and the top surface of the gate dielectric layer 42 is even with the top surface of the insulating layer 32 on both MV region 16 and LV region 18.

Next, another patterned mask (not shown) such as a patterned resist could be formed to cover the insulating layer 32 on the HV region 14 and MV region 16 as the patterned mask includes an opening exposing the top surface of the liner 26 and insulating layer 32 on the LV region 18, and then an ion implantation process is conducted to implant dopants into the fin-shaped structures 24 on the LV region 18 for adjusting threshold voltage (Vt) of the device. The patterned mask is then removed thereafter.

Figure 7:
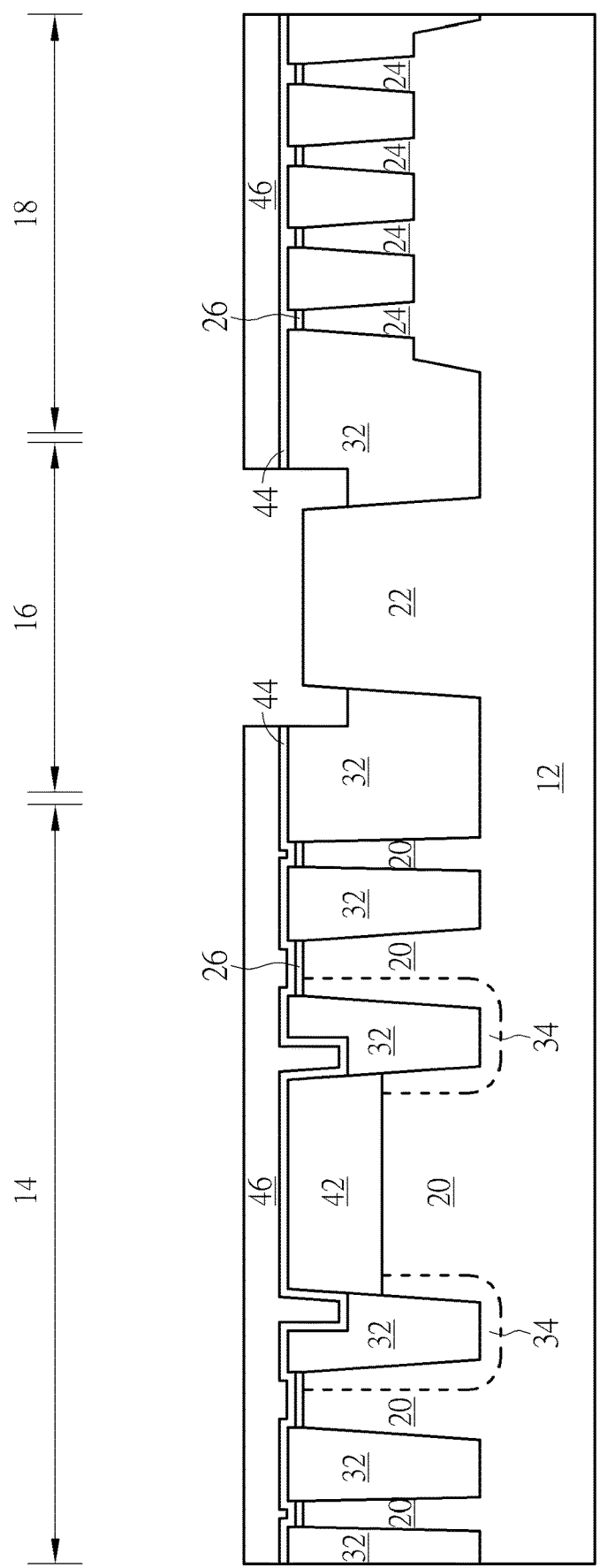

Next, as shown in FIG. 7, a hard mask 44 made of SiN is formed on the HV region 14, the MV region 16, and the LV region 18 including the gate dielectric layer 42 on the HV region 14, the base 24 on the MV region 16, and the fin-shaped structures 24 on the LV region 18, and then another patterned mask 46 such as a patterned resist is formed on the insulating layer 32 on the HV region 14 and LV region 18, in which the patterned mask 46 includes an opening exposing the hard mask 44 on the MV region 16. Next, an etching process is conducted by using the patterned mask 46 as mask to remove the hard mask 44, part of the insulating layer 32, the liner 26, and even part of the base 22 on the MV region 16 for exposing the surface of the base 22.

Figure 8:
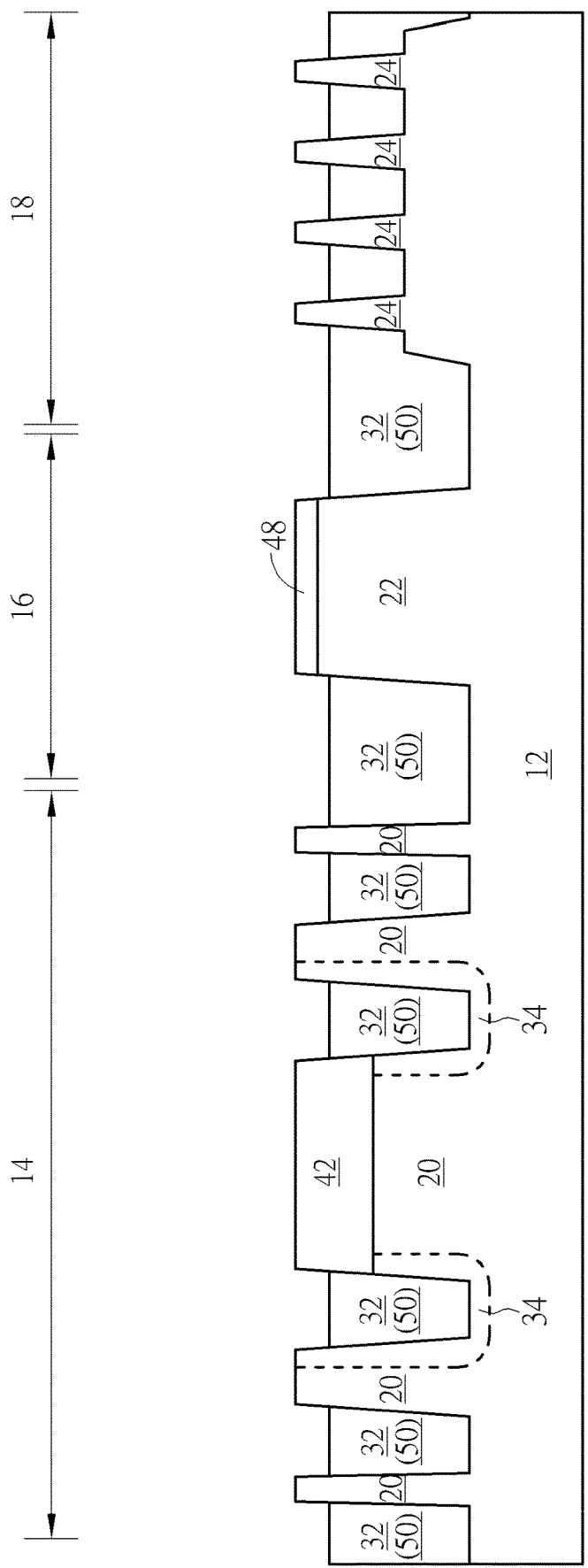

Next, as shown in FIG. 8, another oxide growth process such as a RTO process is conducted to form a gate dielectric layer 48 made of silicon oxide on the base 22 on MV region 16, in which the top surface of the gate dielectric layer 48 on the MV region 16 is even with the top surface of the gate dielectric layer 42 on the HV region 14 while the thickness of the gate dielectric layer 42 on the HV region 14 is greater than the thickness of the gate dielectric layer 48 on the MV region 16. In this embodiment, the thickness of the gate dielectric layer 42 on the HV region 14 could be more than twice such as three times, four times, and even five times the thickness of the gate dielectric layer 48 on the MV region 16.

Next, the patterned mask 46 and remaining hard mask 44 on the HV region 14, MV region 16, and LV region 18 are removed, and an etching process is conducted to completely remove the liner 26 on the fin-shaped structures 24 on the LV region 14 for exposing the top surface of the fin-shaped structures 24 and also remove part of the insulating layer 32 on the HV region 14, MV region 16, and LV region 18 so that the top surface of the insulating layer 32 is slightly lower than the top surface of the bases 20, 22 and the fin-shaped structures 24 for forming a shallow trench isolation (STI) 50. It should be noted that at this stage, the top surface of the gate dielectric layer 42 on the HV region 14 is substantially even with the top surface of the gate dielectric layer 48 on the MV region 16 and the top surface of the fin-shaped structures 24 on the LV region 18.

Figure 9:
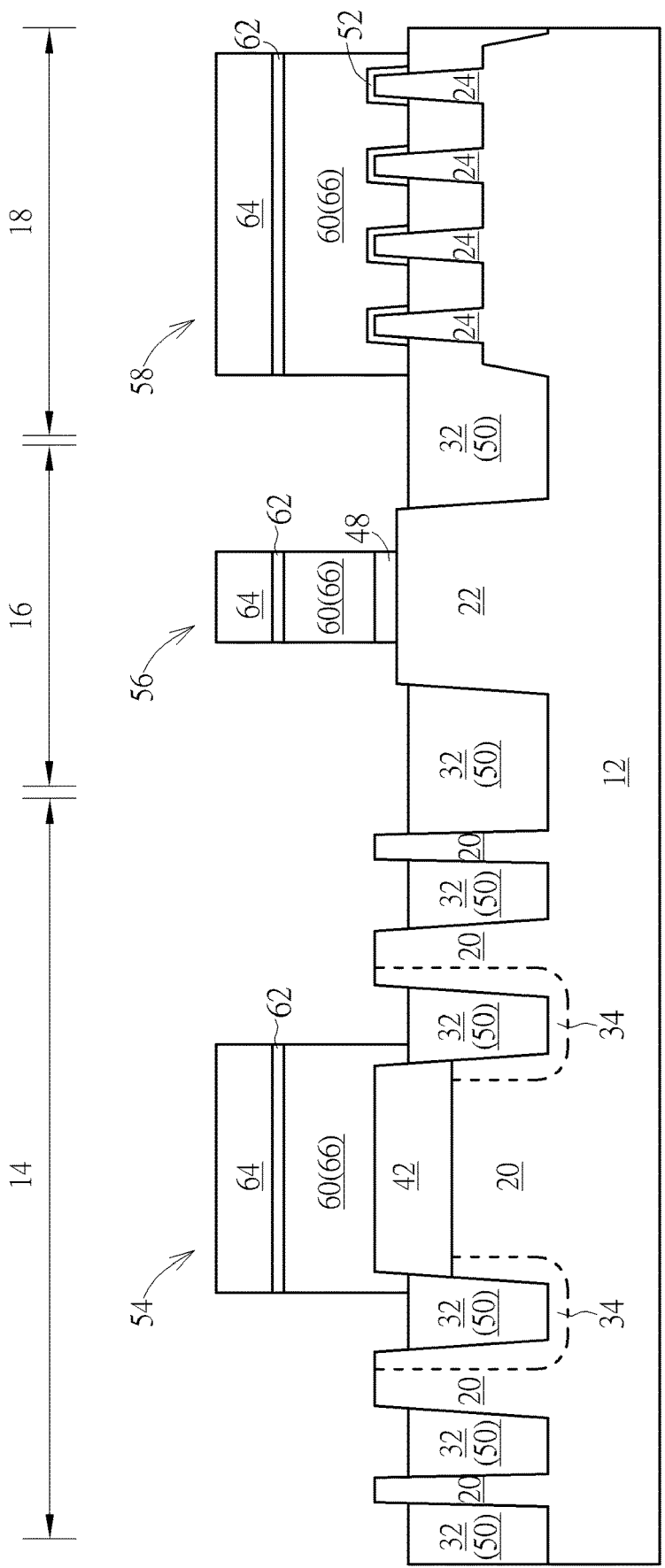

Next, as shown in FIG. 9, an oxidation process such as an in-situ steam generation (ISSG) process is conducted to form a gate dielectric layer 52 on the surface of fin-shaped structures 24 on the LV region 18. Next, gate structures 54, 56, 58 or dummy gates could be formed on the bases 20, 22 and the fin-shaped structures 24 on the HV region 14, MV region 16, and LV region 18. In this embodiment, the formation of the gate structures 54, 56, 58 could be accomplished by a gate first process, a high-k first approach from gate last process, or a high-k last approach from gate last process. Since this embodiment pertains to a high-k last approach, a gate material layer 60 preferably made of polysilicon, a hard mask 62 made of SiN, and a hard mask 64 made of silicon oxide could be formed sequentially on the gate dielectric layers 42, 48, 52, and a pattern transfer process is then conducted by using a patterned resist (not shown) as mask to remove part of the hard masks 62, 64 and part of the gate material layer 60 through single or multiple etching processes. After stripping the patterned resist, gate structures 54, 56, 58 composed of gate dielectric layers 42, 48, 52 respectively and patterned gate material layers 60 are formed on the substrate 12 on each region, in which the patterned gate material layer 60 becomes a gate electrode 66 on each region.

Next, at least a spacer (not shown) is formed on sidewalls of the gate structures 54, 56, 58. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 10:
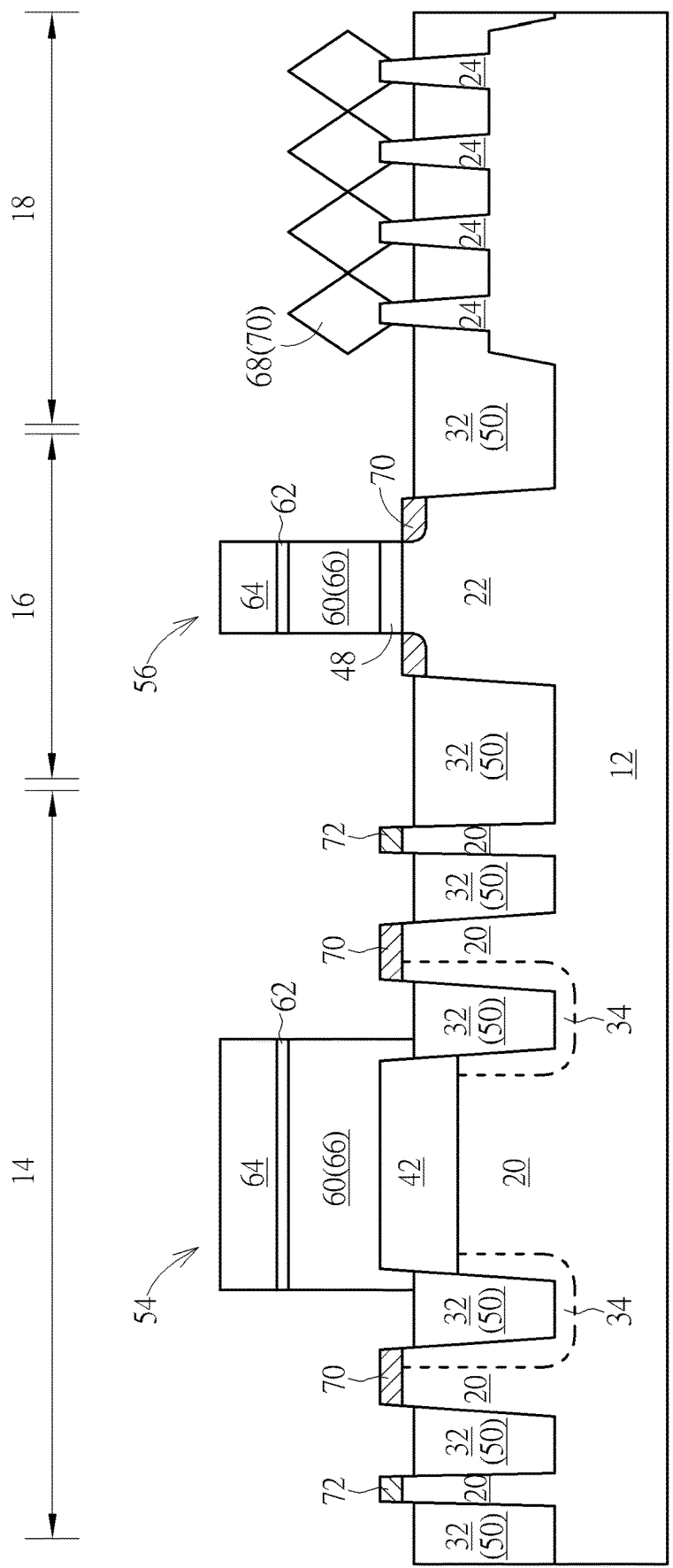

Referring to FIG. 10, FIG. 10 illustrates a method for fabricating a semiconductor device according to an embodiment of the present invention taken along the sectional line AA' of the HV region 14, the sectional line BB' of the MV region 16, and the sectional line DD' of the LV region 18. As shown in FIG. 10, a patterned mask (not shown) such as a patterned resist could be formed to cover the HV region 14 and the MV region 16, and a dry etching and/or wet etching process is conducted one or multiple times by using the patterned mask and the gate structure 58 and spacer on the LV region 18 as mask to remove part of the substrate 12 for forming recesses (not shown) adjacent to two sides of the gate structure 58. Next, a selective epitaxial growth (SEG) process is conducted to form epitaxial layers 68 in the recesses. It should be noted that the epitaxial layers 68 are only formed adjacent to two sides of the gate structure 58 on the LV region 18 while no epitaxial layers are formed on the HV region 14 and the MV region 16. Moreover, part of the hard mask 64 on the LV region 18 could also be removed at the same time during the formation of the recesses so that the top surface of the hard mask 64 is slightly lower than the top surface of the hard mask 64 on the HV region 14 and MV region 16, which is also within the scope of the present invention.

As shown in the cross-section view of FIG. 10, the epitaxial layers 68 on the LV region 18 also share substantially same cross-section shape with the recesses. For instance, the cross-section of each of the epitaxial layers 68 could also include a circle, a hexagon, or an octagon depending on the demand of the product. In this embodiment, the epitaxial layers 68 could also be formed to include different materials depending on the type of transistor being fabricated. For instance, if the MOS transistor being fabricated were to be a PMOS transistor, the epitaxial layers 68 could be made of material including but not limited to for example SiGe, SiGeB, or SiGeSn. If the MOS transistor being fabricated were to be a NMOS transistor, the epitaxial layers 68 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 68 is preferred to have less or no germanium atom at all to facilitate the formation of silicide afterwards.

Next, a photo-etching process could be conducted to remove part of the gate dielectric layer 48 on the MV region 16 for exposing the surface of the base 22 adjacent to two sides of the gate structure 56, and then one or more ion implantation process is conducted to form source/drain regions 70 in the bases 20, 22 adjacent to two sides of the gate structures 54, 56 on the HV region 14 and MV region 16 and at the same time form doped regions serving as an electrostatic discharge (ESD) protection ring 72 in the base 20 around the HV device 114 on the HV region 14. Preferably, the source/drain regions 70 and the ESD protection ring 72 on the HV region 14 include dopants of different conductive type. For instance, either one of the source/drain regions 70 and the ESD protection ring 72 could include n-type dopants while the other include p-type dopants.

According to an embodiment of the present invention, it would also be desirable to form source/drain regions 70 in part or all of the epitaxial layers 68 on the LV region 18. According to another embodiment of the present invention, the source/drain regions 70 could also be formed insituly during the SEG process. For instance, the source/drain regions 70 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 70. Moreover, the dopants within the source/drain regions 70 could also be formed with a gradient, which is also within the scope of the present invention.

Figure 11:
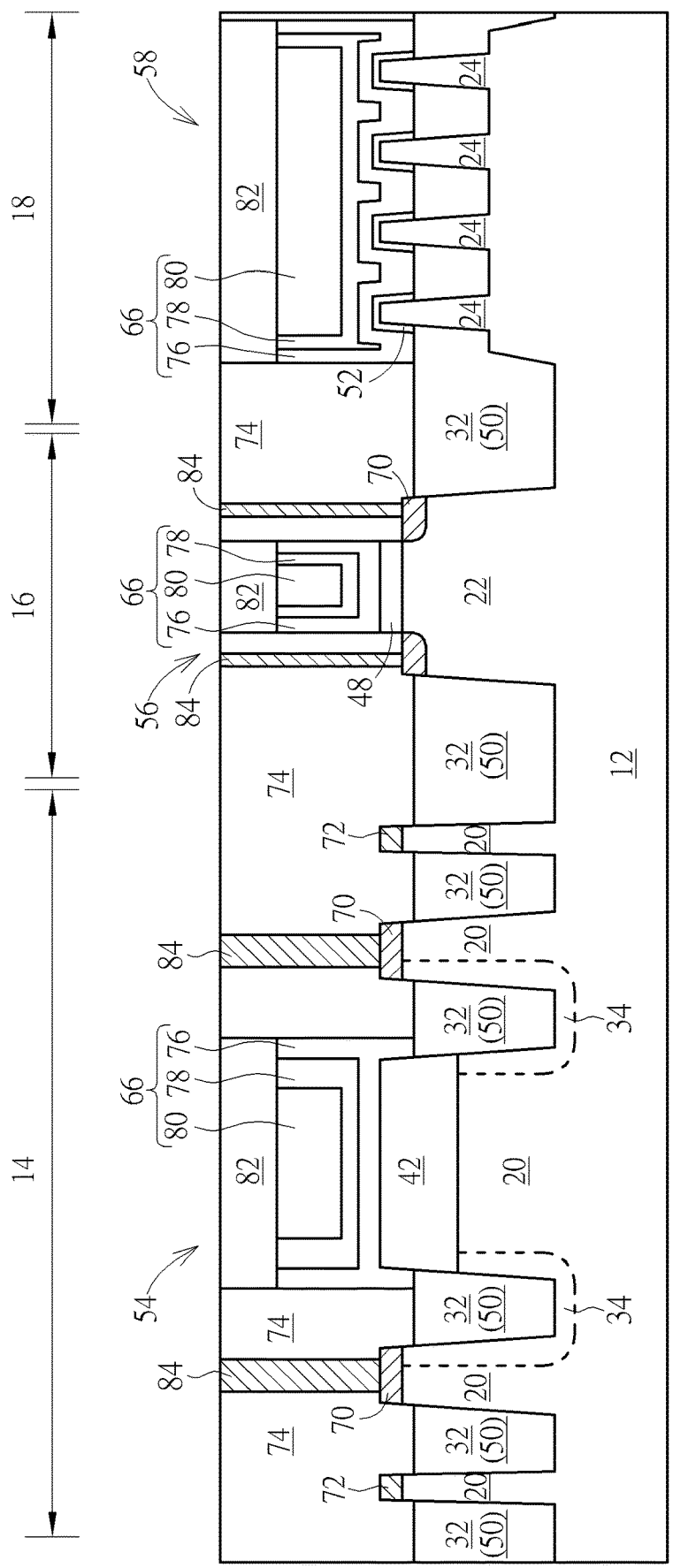

Next, as shown in FIG. 11, a selective contact etch stop layer (CESL) (not shown) could be formed on the substrate 12 surface to cover the gate structures 54, 56, 58 on the HV region 14, MV region 16, and LV region 18, and an interlayer dielectric (ILD) layer 74 is formed on the CESL afterwards. Next, a planarizing process such as a chemical mechanical polishing (CMP) process is conducted to remove part of the ILD layer 74 and part of the CESL so that the top surfaces of the hard mask 64 and ILD layer 74 are coplanar.

Next, a replacement metal gate (RMG) process is conducted to transform the gate structures 54, 56, 58 on the HV region 14, MV region 16, and LV region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 62, 64 and the gate material layers 60 from gate structures 54, 56, 58 for forming recesses (not shown) in the ILD layer 74. Next, a high-k dielectric layer 76, a work function metal layer 78, and a low resistance metal layer 80 are formed in the recesses, and a planarizing process such as CMP is conducted to remove part of low resistance metal layer 80, part of work function metal layer 78, and part of high-k dielectric layer 76 to form metal gates. Preferably, the high-k dielectric layer 76, the work function metal layer 78, and the low resistance metal layer 80 altogether constitute the gate electrode 66 of each of the transistors or devices.

In this embodiment, the high-k dielectric layer 76 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 78 is formed for tuning the work function of the metal gate in accordance with the conductivity of the device. For an NMOS transistor, the work function metal layer 78 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 78 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 78 and the low resistance metal layer 50 may include titanium (Ti), titanium nitride (TiN), tantalum (Ta) or tantalum nitride (TaN). Furthermore, the material of the low-resistance metal layer 80 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 76, part of the work function metal layer 78, and part of the low resistance metal layer 80 are removed to form recesses (not shown), and a hard mask 82 is formed into each of the recesses so that the top surfaces of the hard masks 82 and the ILD layer 74 are coplanar. Preferably the hard masks 82 could include $SiO_2$, SiN, SiON, SiCN, or combination thereof.

Next, a photo-etching process is conducted by using a patterned mask (not shown) as mask to remove part of the ILD layer 74 and part of the CESL adjacent to the gate structures 54, 56, 58 for forming contact holes (not shown) exposing the source/drain regions 70 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 84 electrically connecting the source/drain regions 70. This completes the fabrication of a semiconductor device according to an embodiment of the present invention.

Referring again to FIGS. 1 and 11, FIGS. 1 and 11 illustrate structural views of a semiconductor device according to an embodiment of the present invention. As shown in FIGS. 1 and 11, the semiconductor device includes a substrate having a HV region 14, a MV region 16, and a LV region 18, a HV device 114 disposed on the HV region 14, a MV device 116 disposed on the MV region 16, and a LV device 118 disposed on the LV region 18, an ESD protection ring 72 surrounding the HV device 114, and a STI 50 around the HV device 114, MV device 116, and LV device 118. Preferably, the HV device 114 includes a base 20 disposed on the substrate 12, a gate dielectric layer 42 disposed on the base 20, a gate electrode 66 made of high-k dielectric layer 76, work function metal layer 78, and low resistance metal layer 80 disposed on the gate dielectric layer 42, and source/drain regions 70 disposed in the base 20 adjacent to two sides of the gate electrode 66.

The MV device 116 includes a base 22 disposed on the substrate 12, a gate dielectric layer 48 disposed on the base 22, a gate electrode 66 made of high-k dielectric layer 76, work function metal layer 78, and low resistance metal layer 80 disposed on the gate dielectric layer 48, and source/drain regions 70 disposed in the base 22 adjacent to two sides of the gate electrode 66. The LV device 118 includes a plurality of fin-shaped structures 24 disposed on the substrate 12, a gate dielectric layer 52 disposed on the fin-shaped structures 24, a gate electrode 66 made of high-k dielectric layer 76, work function metal layer 78, and low resistance metal layer 80 disposed on the gate dielectric layer 52, and source/drain regions 70 disposed in the fin-shaped structures 24 adjacent to two sides of the gate electrode 66.

Viewing from a more detailed perspective, the top surface of the gate electrode 66 on the HV region 14 is even with the top surface of the gate electrodes 66 on the MV region 16 and LV region 18, the top surface of the gate dielectric layer 42 on HV region 14 is even with the top surface of the gate dielectric layer 48 on the MV region 16 and the top surface of the fin-shaped structures 24 on the LV region 18, the top surface of the gate dielectric layer 52 on the LV region 18 could be slightly higher than the top surface of the gate dielectric layer 42 on the HV region 14 and the top surface of the gate dielectric layer 48 on the MV region 16, the top surface of the source/drain region 70 on the HV region 14 is even with the top surface of the fin-shaped structures 24 on the LV region, and the top surface of the ESD protection ring 72 is even with the top surfaces of the source/drain region 70 on the HV region 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate having a high-voltage (HV) region, a medium-voltage (MV) region, and a low-voltage (LV) region;
   a HV device on the HV region, wherein the HV device comprises:
      a first base on the substrate;
      a first gate dielectric layer on the first base;
      a first gate electrode on the first gate dielectric layer;
      a first source/drain region adjacent to the first gate electrode;
   a shallow trench isolation (STI) around the first base, wherein a bottom surface of the first source/drain region is higher than a top surface of the STI;
   an electrostatic discharge (ESD) protection ring around the HV device, wherein a bottom surface of the ESD protection ring is higher than the top surface of the STI and a bottom surface of the first gate dielectric layer;
   a LV device on the LV region, wherein the LV device comprises:
      a fin-shaped structure on the substrate;
      a second gate electrode on the fin-shaped structure, wherein a top surface of the first gate dielectric layer, the first gate dielectric layer directly contacting the STI, is even with a top surface of the fin-shaped structure;

a second gate dielectric layer between the fin-shaped structure and the second gate electrode, wherein a top surface of the second gate dielectric layer is higher than the top surface of the first gate dielectric layer; and a MV device on the MV region, wherein the MV device comprises:

a second base on the substrate, wherein a top surface of the second base is lower than a top surface of the first gate dielectric layer;

a third gate dielectric layer on the second base;

a third gate electrode on the third gate dielectric layer; and a second source/drain region adjacent to the third gate electrode, wherein a top surface of the second source/drain region in the MV device is coplanar to the bottom surface of the ESD protection ring.

2. The semiconductor device of claim 1, wherein a top surface of the first gate electrode is even with a top surface of the second gate electrode.

3. The semiconductor device of claim 1, wherein a top surface of the first source/drain region is even with the top surface of the fin-shaped structure.

4. The semiconductor device of claim 3, further comprising the shallow trench isolation (STI) between the first base and the first source/drain region.

5. The semiconductor device of claim 1, wherein a top surface of the ESD protection ring is even with the top surface of the first source/drain region.

6. The semiconductor device of claim 1, wherein a top surface of the third gate dielectric layer is even with the top surface of the first gate dielectric layer.

7. The semiconductor device of claim 1, wherein a top surface of the first gate electrode is even with a top surface of the third gate electrode.

* * * * *